(12) United States Patent
Wang et al.

(10) Patent No.: US 10,510,851 B2
(45) Date of Patent: Dec. 17, 2019

(54) LOW RESISTANCE CONTACT METHOD AND STRUCTURE

(71) Applicant: Taiwan Semiconductor Manufacturing Company, Ltd., Hsinchu (TW)

(72) Inventors: Yu-Sheng Wang, Tainan (TW); Yu-Ting Lin, Tainan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/583,570

(22) Filed: May 1, 2017

(65) Prior Publication Data

US 2018/0151679 A1 May 31, 2018

Related U.S. Application Data

(60) Provisional application No. 62/427,716, filed on Nov. 29, 2016.

(51) Int. Cl.
*H01L 29/417* (2006.01)
*H01L 29/66* (2006.01)
(Continued)

(52) U.S. Cl.
CPC .. *H01L 29/41791* (2013.01); *H01L 21/02063* (2013.01); *H01L 21/261* (2013.01); *H01L 21/2633* (2013.01); *H01L 21/3221* (2013.01); *H01L 21/76889* (2013.01); *H01L 21/76897* (2013.01); *H01L 21/823431* (2013.01); *H01L 21/823468* (2013.01); *H01L 21/823475* (2013.01); *H01L 29/456* (2013.01); *H01L 29/6656* (2013.01); *H01L 29/66795* (2013.01);
(Continued)

(58) Field of Classification Search
CPC ............. H01L 29/6653; H01L 29/6656; H01L 29/66553; H01L 21/02063; H01L 21/2633; H01L 21/216; H01L 21/76897; H01L 21/823475; H01L 21/823425
See application file for complete search history.

(56) References Cited

U.S. PATENT DOCUMENTS

5,885,896 A * 3/1999 Thakur ............ H01L 21/28518
257/E21.165
6,348,379 B1 * 2/2002 Wang ................ H01L 21/76897
257/E21.507
(Continued)

*Primary Examiner* — Sophia T Nguyen
(74) *Attorney, Agent, or Firm* — Slater Matsil, LLP (57) ABSTRACT

A device includes a metal-silicide region formed in a semiconductor material in a contact opening. A concentration of a material, including chlorine, fluorine, or a combination thereof is in the metal-silicide region near an uppermost surface of the metal-silicide region. The presence of chlorine or fluorine results from a physical bombarding of the chlorine or fluorine in the contact opening. As a result of the physical bombard, the opening becomes wider at the bottom of the opening and the sidewalls of the opening are thinned. A capping layer is over the metal-silicide region and over sidewalls of a contact plug opening. A contact plug is formed over the capping layer, filling the contact plug opening. Before the contact plug is formed, a silicidation occurs to form the metal-silicide and the metal-silicide is wider than the bottom of the opening.

20 Claims, 11 Drawing Sheets

(51) Int. Cl.
*H01L 21/8234* (2006.01)
*H01L 21/263* (2006.01)
*H01L 21/261* (2006.01)
*H01L 21/265* (2006.01)
*H01L 29/78* (2006.01)
*H01L 21/02* (2006.01)
*H01L 29/45* (2006.01)
*H01L 21/322* (2006.01)
*H01L 21/768* (2006.01)

(52) U.S. Cl.
CPC .. *H01L 21/26506* (2013.01); *H01L 21/76804* (2013.01); *H01L 21/823425* (2013.01); *H01L 29/665* (2013.01); *H01L 29/6653* (2013.01); *H01L 29/66545* (2013.01); *H01L 29/7845* (2013.01); *H01L 29/7855* (2013.01)

(56) References Cited

U.S. PATENT DOCUMENTS

| | | | | |
|---|---|---|---|---|
| 6,475,847 | B1* | 11/2002 | Ngo | H01L 21/76829 257/314 |
| 6,670,682 | B1* | 12/2003 | Mouli | G06Q 10/063 257/296 |
| 6,790,765 | B1* | 9/2004 | Huang | H01L 21/76897 257/E21.507 |
| 6,797,611 | B1* | 9/2004 | Wu | H01L 21/76816 257/774 |
| 8,772,109 | B2 | 7/2014 | Colinge | |
| 8,785,285 | B2 | 7/2014 | Tsai et al. | |
| 8,816,444 | B2 | 8/2014 | Wann et al. | |
| 8,823,065 | B2 | 9/2014 | Wang et al. | |
| 8,860,148 | B2 | 10/2014 | Hu et al. | |
| 8,927,407 | B2* | 1/2015 | Baars | H01L 21/76897 257/288 |
| 9,105,490 | B2 | 8/2015 | Wang et al. | |
| 9,231,098 | B2* | 1/2016 | Wang | H01L 21/76897 |
| 9,236,267 | B2 | 1/2016 | De et al. | |
| 9,236,300 | B2 | 1/2016 | Liaw | |
| 9,287,138 | B2* | 3/2016 | Wang | H01L 29/0653 |
| 9,520,482 | B1 | 12/2016 | Chang et al. | |
| 9,564,363 | B1* | 2/2017 | Wang | H01L 21/76897 |
| 9,576,814 | B2 | 2/2017 | Wu et al. | |
| 9,589,851 | B2* | 3/2017 | Bu | H01L 21/823871 |
| 2002/0045355 | A1* | 4/2002 | Chong | H01J 37/32192 438/721 |
| 2002/0132403 | A1* | 9/2002 | Hung | H01L 21/76897 438/186 |
| 2002/0140100 | A1* | 10/2002 | Yokoyama | H01L 21/76897 257/760 |
| 2003/0216004 | A1* | 11/2003 | Jeong | H01L 21/31111 438/279 |
| 2003/0236003 | A1* | 12/2003 | Koo | H01L 21/28518 438/795 |
| 2004/0058548 | A1* | 3/2004 | Sohn | H01L 21/26513 438/694 |
| 2005/0142690 | A1* | 6/2005 | Lee | H01L 21/324 438/72 |
| 2005/0245073 | A1* | 11/2005 | Lee | H01L 21/02063 438/629 |
| 2006/0258091 | A1* | 11/2006 | DeLoach | H01L 21/28052 438/257 |
| 2006/0263985 | A1* | 11/2006 | Kang | H01L 21/823814 438/275 |
| 2007/0241199 | A1* | 10/2007 | Yamazaki | G06K 19/07749 235/492 |
| 2008/0309581 | A1* | 12/2008 | Fujii | H01Q 1/2225 343/873 |
| 2009/0149020 | A1* | 6/2009 | Hayashi | C23C 16/14 438/653 |
| 2009/0191703 | A1* | 7/2009 | Lu | H01L 21/02063 438/637 |
| 2009/0321942 | A1* | 12/2009 | Sell | H01L 21/76897 257/763 |
| 2010/0227472 | A1* | 9/2010 | Futase | H01L 21/02063 438/653 |
| 2012/0052661 | A1* | 3/2012 | Sasagawa | H01L 21/32137 438/479 |
| 2012/0313158 | A1* | 12/2012 | Yin | H01L 21/28194 257/316 |
| 2013/0020616 | A1* | 1/2013 | Ayala | H01L 29/7843 257/288 |
| 2013/0049219 | A1* | 2/2013 | Tsai | H01L 21/28518 257/774 |
| 2013/0071981 | A1* | 3/2013 | Huang | H01L 21/823412 438/301 |
| 2013/0092984 | A1* | 4/2013 | Liu | H01L 29/66795 257/288 |
| 2013/0193526 | A1* | 8/2013 | Lo | H01L 27/0255 257/401 |
| 2013/0288468 | A1* | 10/2013 | Chi | H01L 29/665 438/525 |
| 2014/0051239 | A1* | 2/2014 | Breyta | H01L 21/823475 438/586 |
| 2014/0353734 | A1* | 12/2014 | Xie | H01L 21/283 257/288 |
| 2015/0228537 | A1* | 8/2015 | Chang | H01L 21/76879 257/741 |
| 2015/0243663 | A1* | 8/2015 | Hung | H01L 21/823821 257/365 |
| 2015/0263109 | A1* | 9/2015 | Chen | H01L 21/76814 257/410 |
| 2015/0372099 | A1* | 12/2015 | Chen | H01L 29/41725 438/586 |
| 2016/0043176 | A1* | 2/2016 | Wang | H01L 29/0847 257/408 |
| 2016/0043197 | A1* | 2/2016 | Kim | H01L 21/31116 438/283 |
| 2016/0064516 | A1* | 3/2016 | Lee | H01L 29/66545 257/288 |
| 2016/0233164 | A1* | 8/2016 | Choi | H01L 27/0924 |
| 2016/0307758 | A1* | 10/2016 | Li | H01L 21/02167 |
| 2016/0351570 | A1* | 12/2016 | Park | H01L 27/0924 |
| 2017/0011967 | A1* | 1/2017 | Yeo | H01L 21/823814 |
| 2017/0018460 | A1* | 1/2017 | Hsu | H01L 21/823475 |
| 2017/0170292 | A1* | 6/2017 | Liu | H01L 21/3083 |
| 2017/0222014 | A1* | 8/2017 | Tak | H01L 23/485 |
| 2017/0287780 | A1* | 10/2017 | Park | H01L 21/76897 |
| 2017/0323966 | A1* | 11/2017 | Pradhan | H01L 29/78 |
| 2017/0330963 | A1* | 11/2017 | Tsai | H01L 29/785 |
| 2017/0365674 | A1* | 12/2017 | Lee | H01L 29/41791 |
| 2018/0151679 | A1* | 5/2018 | Wang | H01L 21/0206 |
| 2018/0174913 | A1* | 6/2018 | More | H01L 21/823431 |
| 2018/0190659 | A1* | 7/2018 | Chang | H01L 27/10855 |
| 2019/0115256 | A1* | 4/2019 | Wang | H01L 21/76895 |

\* cited by examiner

LOW RESISTANCE CONTACT METHOD AND STRUCTURE

PRIORITY CLAIM

This application claims the benefit of U.S. Provisional Application No. 62/427,716, filed on Nov. 29, 2016 and entitled "Low Resistant Contact Method and Structure," which application is incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The FinFETs include vertical semiconductor fins above a substrate. The semiconductor fins are used to form source and drain regions, and to form channel regions between the source and drain regions. Shallow Trench Isolation (STI) regions are formed to define the semiconductor fins. The FinFETs also include gate stacks, which are formed on the sidewalls and the top surfaces of the semiconductor fins. Although existing FinFET devices and methods of fabricating FinFET devices have been generally adequate for their intended purposes, they have not been entirely satisfactory in all respects.

Low-resistant contacts are increasingly important since the total area available to create contacts is also being down-scaled as technology and manufacturing down-scale other aspects of semi-conductors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide the ability to lower resistance of a contact. In general, one can lower resistance of a contact by improving the conductivity of contact by increasing the contact area of the contact or reducing the resistance of the contact materials. For example, some interconnects can use a seed layer to improve conductivity at an interface of two separate materials. In accordance with embodiments of the present disclosure, a silicide can be formed at the interface of two materials to increase conductivity (or lower resistivity) of the contact. In addition, in some embodiments, a pre-clean and chemical reaction can be applied to the contact interface, thereby causing an increase in both the width and depth of the silicide. A contact can be formed over the contact interface. Although the formation of the contact is explained in relation to a FinFET, one of ordinary skill in the art would understand that the application of the contact and contact formation structures and methods as discussed herein are not limited to use in a FinFET structure.

Figure 1:
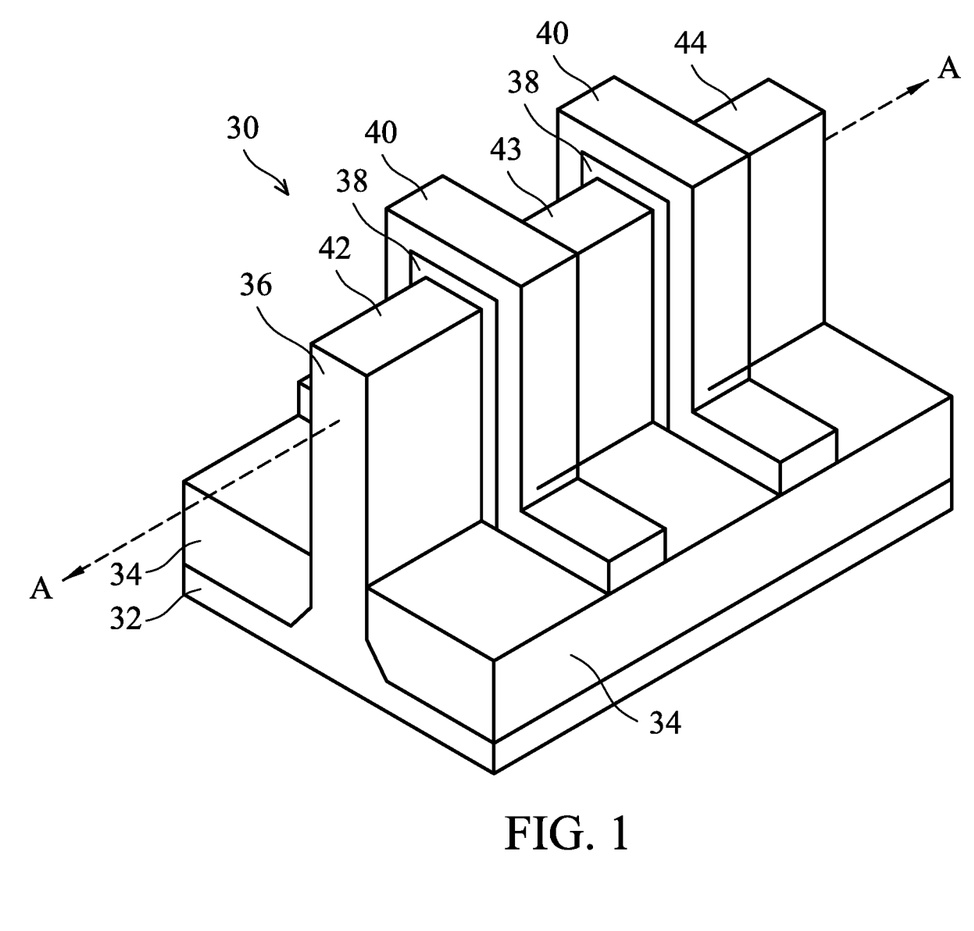
FIG. 1 is an example of a Fin Field-Effect Transistor (finFET) in a three-dimensional view.

FIG. 1 illustrates an example of a FinFET 30 in a three-dimensional view. The FinFET 30 comprises a fin 36 on a substrate 32. The substrate 32 includes isolation regions 34, and the fin 36 protrudes above and from between neighboring isolation regions 34. The FinFET 30 contains two gates 38/40 in this example, however the FinFET could contain one gate or more than two gates. A gate dielectric 38 is along sidewalls and over a top surface of the fin 36, and a gate electrode 40 is over the gate dielectric 38. Source/drain regions 42 and 43 and 43 and 44 are disposed in the fin on opposite sides of the gate 38/40. FIG. 1 further illustrates a reference cross-section that is used in later figures. Cross-section A-A bisects the fin 36 along its length. Subsequent figures refer to this reference cross-section.

FIGS. 2 through 9 are cross-sectional views of intermediate stages in the formation of a contact in accordance with an example embodiment. Reference numerals used in the figures can include letters to distinguish a particular structure from another where otherwise they are equivalent, interchangeable, or functionally indistinguishable. Where such letters are used, the reference number without a corresponding letter indicates both/all of the particular structures. For example, a reference to 103 by itself would include a generalized structure corresponding to 103a, 103b, 103c, etc.

Figure 2:
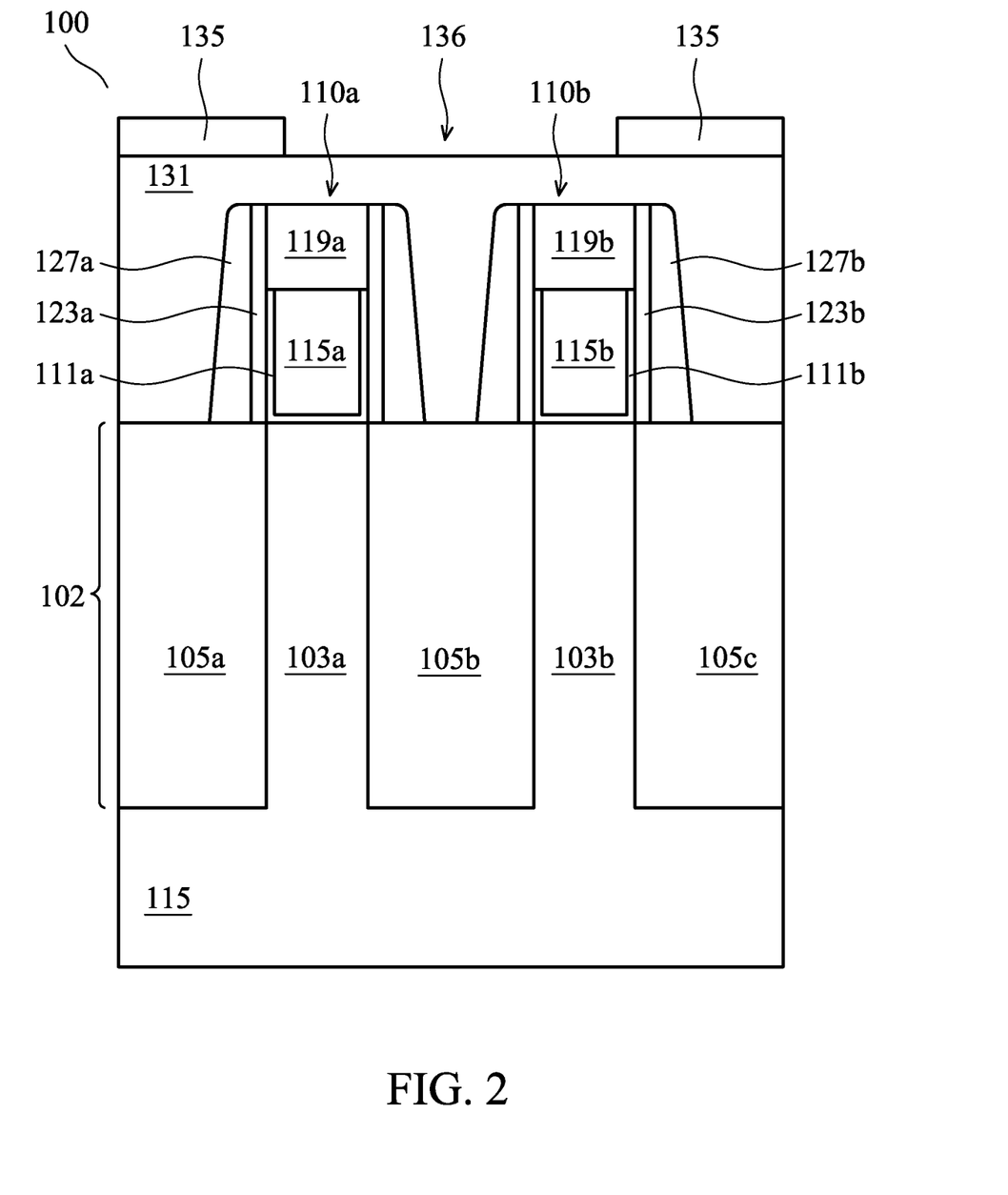
FIGS. 2-9 are examples of a FinFET at various stages of development, in accordance with some embodiments.
Figure 3:
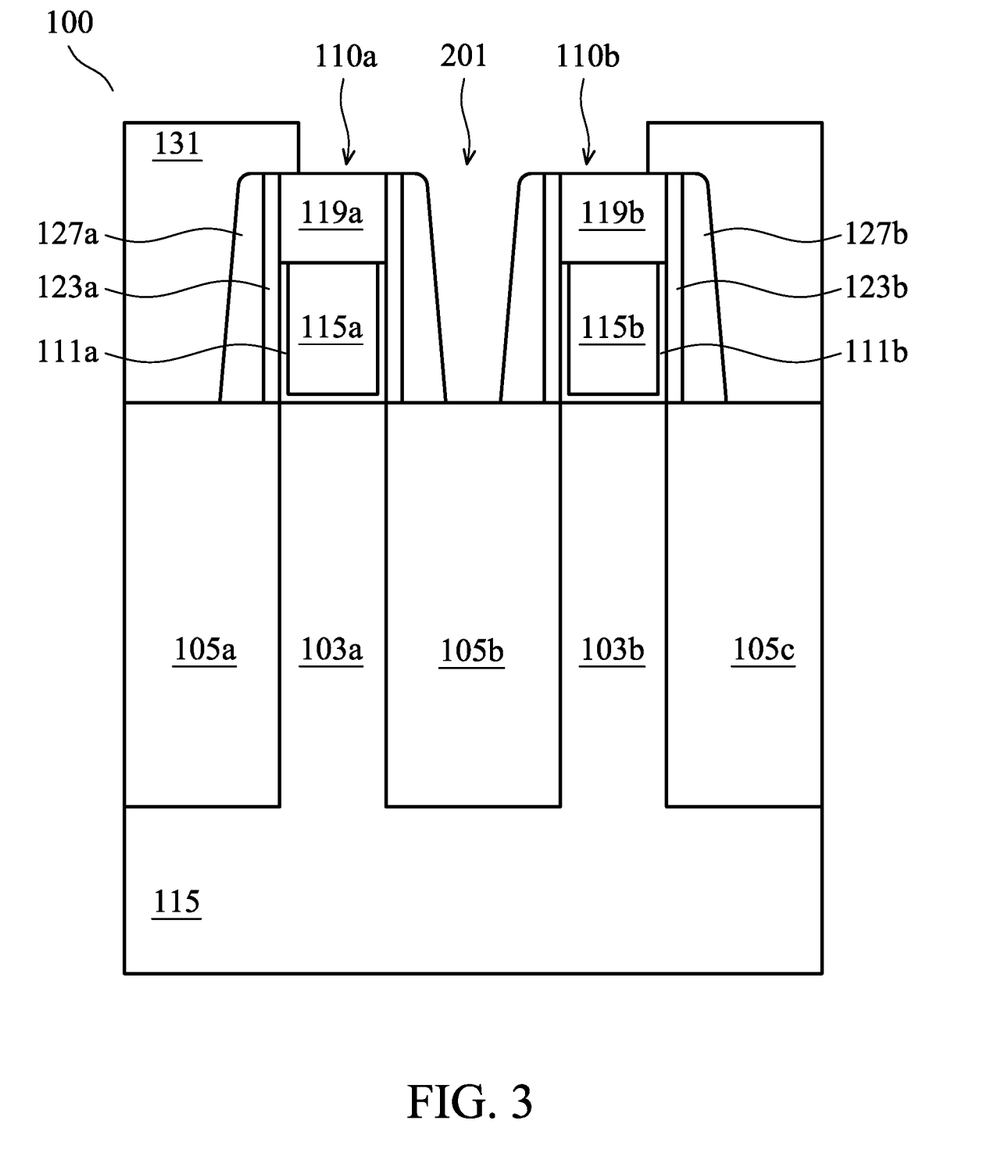

FIG. 2 includes a semiconductor device 100 having a semiconductor substrate 115, with fins 102 formed thereon. Semiconductor device 100 can be an active device such as a transistor, although other embodiments may include various other active and passive devices such as resistors, capacitors, inductors, diodes, varactors, the like, or a combination thereof. A fin, such as fin 36 of FIG. 1 or 102 of FIG. 3, is made of semiconductor fin material 103a/103b and source/drain material 105a/105b/105c. Semiconductor fin material 103a/103b can be formed from a semiconductor substrate 115. Semiconductor substrate 115 can be part of a semiconductor wafer or a semiconductor device. In accordance with some embodiments of the present disclosure, semiconductor substrate 115 includes crystalline silicon. Other materials that can be used in the substrate 115 include carbon, germanium, gallium, boron, arsenic, nitrogen, indium, and/or phosphorus, and the like. Semiconductor substrate 115 may also include other semiconductor materials such as III-V compound semiconductor materials. Semiconductor substrate 115 can be a bulk substrate or a Semiconductor-on-Insulator (SOI) substrate. Furthermore, the substrate 115 may include other features. For example, the substrate may include various doped regions depending on design requirements (e.g., p-type substrate or n-type substrate). For example, the doped regions may be doped with p-type dopants, such as boron or $BF_2$, n-type dopants, such as phosphorus or arsenic, and/or combinations thereof. The doped regions may be configured for an n-type FinFET, or alternatively configured for a p-type FinFET.

In accordance with some embodiments, one or more gate stacks 110 can be formed over the semiconductor fins 102. Semiconductor fins 102 includes source/drain material 105a/105b/105c and semiconductor fin material 103a/103b. Gate stacks 110 can comprise a metal gate electrode 115a/115b, a gate insulator or dielectric 111a/111b, an optional first gate spacer 123a/123b, a second gate spacer 127a/127b, and a self-aligned contact/hardmask 119a/119b formed over the metal gate 115a/115b.

In some embodiments, gate stacks 110 can be formed using a gate-first approach, while in other embodiments gate structures 110 can be formed using a gate-last approach. Gate stacks 110a and 110b are formed over the substrate 103a/103b.

In some embodiments dummy gate stacks can be formed first. The dummy gate stacks can include a dummy gate dielectric, a hard mask, and a dummy gate electrode. The dummy gate stacks can be replaced by gate stacks 110a/110b. The dummy gate electrode and dummy gate dielectric can be etched and removed. Gate dielectric 111a/111b can be deposited conformally in recesses left by removal of dummy gate electrode and dummy gate dielectric. Gate dielectric layers 111a/111b can comprise silicon oxide, silicon nitride, or multilayers thereof. In some embodiments, gate dielectric layers 111a/111b include a high-k dielectric material, and may include a metal oxide or a silicate of Hf, Al, Zr, La, Mg, Ba, Ti, Pb, and combinations thereof. The formation methods of gate dielectric layers 111a/111b may include molecular-beam deposition (MBD), ALD, PECVD, and the like.

Gate electrodes 115a/115b are deposited over gate dielectric layers 111a/111b, respectively, and fill the remaining portions of the recesses. Gate electrodes 115a/115b may be made of a metal-containing material such as TiN, TaN, TaC, Co, Ru, Al, combinations thereof, or multi-layers thereof. After the filling of gate electrodes 40, a planarization process, such as a CMP process, may be performed to remove excess portions of gate dielectric layers 111a/111b and the material of gate electrodes 115a/115b. The gate electrodes 115a/115b and the gate dielectrics 111a/111b are recessed in one or more etching steps so that recesses are formed within the gate spacers 123/127. An acceptable etching process can be used, such as one that is selective to the materials of the gate electrodes 115a/115b and the gate dielectrics 111a/111b. The recesses allow for subsequently formed hard masks 119a/119b to be formed within the recesses to protect the replacement gates 115a/115b.

A hard mask 119a/119b is formed within the recesses over gate electrodes 115a/115b and the gate dielectrics 111a/111b. The hard mask 119a/119b can be made of SiN, SiON, $SiO_2$, the like, or a combination thereof. The hard mask 119a/119b can be formed by CVD, PVD, ALD, a spin-on-dielectric process, the like, or a combination thereof.

Source/drain regions 105a/105b/105c can be formed in the substrate 115. Source/drain regions 105a/105b/105c can be formed after the formation of the dummy gate stacks or after the formation of the gate stacks 110a/110b. In some embodiments, the source/drain regions 105a/105b/105c may be doped by performing an implanting process to implant appropriate dopants to complement the dopants in the substrate 115. In other embodiments, the source/drain regions 105a/105b/105c can be formed by forming recesses (not shown) in substrate 115 and epitaxially growing material in the recesses. The recesses may be formed by etching using any acceptable etch process, such as a RIE, NBE, tetramethylammonium hydroxide (TMAH), ammonium hydroxide ($NH_4OH$), a wet etchant capable of etching silicon with good etch selectivity between silicon and a material of isolation regions (not shown), the like, or a combination thereof. The etch may be anisotropic. The etching of the semiconductor fins 102 may be performed in a single etch process or multiple etch processes. The source/drain regions 105a/105b/105c can be formed in the recesses by epitaxially growing a material 105a/105b/105c in the recesses, such as by metal-organic CVD (MOCVD), molecular beam epitaxy (MBE), liquid phase epitaxy (LPE), vapor phase epitaxy (VPE), selective epitaxial growth (SEG), the like, or a combination thereof.

The source/drain regions 105a/105b/105c may be doped either through an implantation method as discussed above, or else by doping in place as the material is grown. Epitaxial source/drain regions 105a/105b/105c may include any acceptable material, such as appropriate for n-type FETs and/or p-type FETs. For example, in an n-type configuration, if the substrate 115 is silicon, the epitaxial source/drain regions 105a/105b/105c may include silicon, SiC, SiCP, SiP, or the like. For example, in an n-type configuration, if the substrate 115 is silicon, the epitaxial source/drain regions 105a/105b/105c may include SiGe, SiGeB, Ge, GeSn, or the like. Epitaxial source/drain regions 105a/105b/105c may have surfaces raised above top surfaces of the substrate 115 and may have facets.

After the FinFET is formed, in some embodiments, a dielectric layer 131 can be formed over the structure. Contacts can be formed in the dielectric layer to electrically couple the gate and source/drain regions to other devices or structures. In some embodiments, dielectric layer 131 can include multiple layers.

Element 135 of FIG. 2 illustrates the addition of a photoresist layer or silicon oxide resist layer 135 that is deposited over substrate 115 and then patterned, thereby forming openings 136 in the resist layer 135. Generally, photolithography techniques utilize a photoresist material (such as photo resist 135) that is deposited, irradiated (exposed), and developed to remove a portion of the photoresist material. The remaining photoresist material protects the underlying material, such as the dielectric 131 in this example, from subsequent processing steps, such as etching. In this example, the photoresist material is patterned to define an area that will be etched and, conversely, an area that will be protected from etchant. In embodiments where a dielectric 131 was not used, then a photoresist 135 is not used.

Notably the opening 136 can be wider than a width between the gate structures 110a/110b. Or in other words, the opening 136 does not have to be precisely over the gate structures 110a/110b. In some embodiments, the opening 136 can span multiple gate stacks.

FIG. 3 illustrates a cross-section of the FinFET after etching the dielectric layer 131 that was left exposed by the photo resist mask 135. Etching the dielectric layer 131 can be done by any suitable technique, for example, using a wet or dry etchant that is selective to the dielectric material of dielectric layer 131. Following the etching, the photoresist 135 can be removed. The etching forms an opening 201 between the gate structures 110a/110b, and the top of the source/drain 105b is exposed.

When the source/drain 105b is exposed, an oxide can form. For example, if the source/drain 105b is silicon-based, the top of the source/drain 105b can have silicon oxide (SiO) at the top of the fin. An oxide can interfere with the formation of a contact on the source/drain 105b by causing an increased resistivity. Therefore, the oxide can be cleaned/removed prior to formation of the contact.

Figure 4:
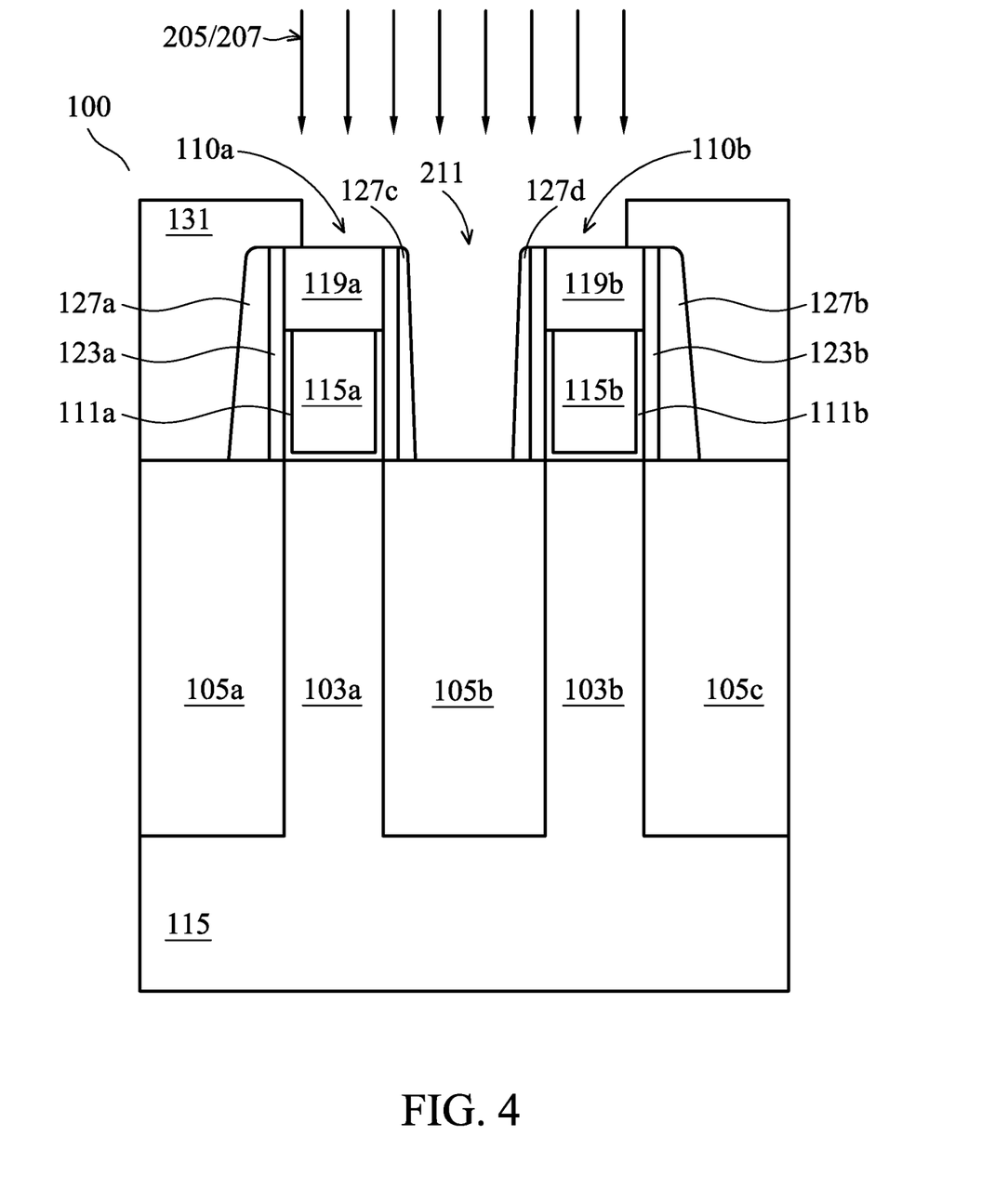

FIG. 4 illustrates a pre-clean process 205 and physical bombard 207. A pre-clean process is performed 205 using argon (Ar) gas as cleaning etchant. Other cleaning etchants can be used, such as $NF_3$, $NH_3$, $H_2$, $N_2$, mixed gas $Ar/H_2$, and $Ar/N_2$. A physical bombard 207 can be performed subsequent to, alternating with, or simultaneously with the pre-clean process 207.

In some embodiments, an RF generator (not pictured) can be used in an etching chamber (not pictured) or in the deposition chamber (not pictured) to create a plasma using a power up to about 1.5 kW, such as about 200 W. In other embodiments, the power can be increased up to about 1.5 kW, such as to about 400 W. In the pre-clean process 205, the chamber is filled with Ar gas and the opening 201 is exposed to the plasma generated within the etching chamber. In the physical bombard 207 process a bombard material can be added to the etching chamber. The bombard material can be chlorine gas, fluorine gas, ammonia gas, or a combination thereof. The opening 201 is exposed to the plasma. When the opening 201 is exposed to the pre-clean process and bombard material, the opening 201 will widen to the opening 211. The opening 211 has side walls comprised of the gate spacers 127c/127d, which have been thinned in the clean etching/physical bombard processes.

In accordance with some embodiments, the physical bombardment is performing using a process gas as the bombard material as described above. Other process gasses may be present, including argon, helium, nitrogen ($N_2$), hydrogen ($H_2$), xenon, arsenic, germanium, phosphorous, and the like. Ions are generated from the bombard material and used to bombard the opening 201. The bombardment is performed in a vacuumed environment (such as an etching chamber). The flow rate of the process gas may be in the range between about 1 sccm and about 20,000 sccm. The pressure of the process gas may be in the range between about 0.1 mtorr and about 1 torr. The bias may be between about 20 eV and about 5 KeV. The duration of the bombardment may be between about 1 second and about 90 seconds.

The surface regions that are bombarded include the top surface of source/drain 105b and the gate spacer surfaces 127c/127d. The gate spacers and source/drain 105b can include a native oxide. As a result of the bombardment, surface regions become rougher and the gate spacers 127c/127d are thinned. In addition, the bonds of the materials (such as oxides) in the bombarded surface regions may be broken or loosened. As a result, the bombarded surface regions may adsorb more process gases in a subsequent chemical reaction step.

In the bombardment, the ions may be implanted into source/drain regions 105b. The implanted ions can have the function of reducing the resistance between the subsequent formed silicide regions as well as contact plugs and source/drain regions 105b. This may reduce the contact resistance of the contact plugs. The contact resistance may further be adjusted by adjusting the type of bombardment ions and the energy of the bombardment.

In the physical bombard process 207, a chemical reaction will take place at the exposed surface of the source/drain region 105b between the bombard material and the source/drain region 105b, and the bombard material will be incorporated into the top part of the source/drain region 105b. For example, where ammonium fluoride gas is used as bombard material, ammonium fluoride can react with silicon oxide, resulting in ammonium fluorosilicate compound. The physical bombard process 207 can include multiple cycles to provide multiple gas reactions. The gas injection can be tunable according to the plasma process to inject gas by particular zones across the bottom of the opening 211.

The pre-clean process 205 and physical bombard 207 can be performed simultaneously by filling the etching chamber with a gas cleaning etchant (e.g., argon gas) and a physical bombard material (e.g., chlorine, fluorine, ammonia, or combination thereof) at the same time. Additional gases can be present, including hydrogen and nitrogen gases.

Figure 5:
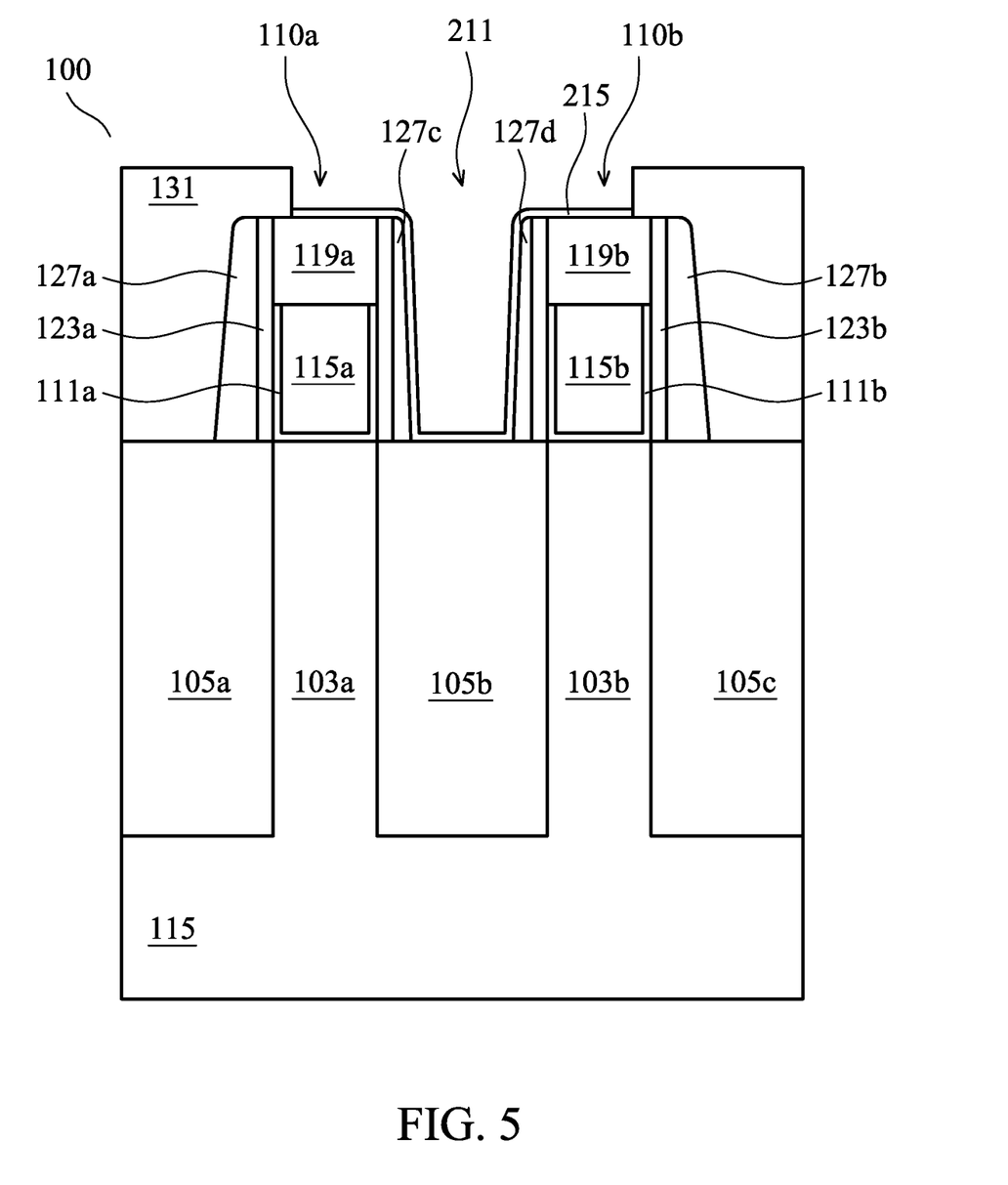

Referring to FIG. 5, a metal layer 215 can be formed on the exposed surfaces of the opening 211. In some embodiments, the metal layer 215 will be substantially consumed by the subsequent process of forming the metal-silicide layer 225 of FIG. 7. The metal layer 215 may be formed of titanium, nickel, cobalt, tungsten, platinum, molybdenum, tantalum, the like, or a combination thereof. As illustrated in FIG. 5, the metal layer 215 includes a portion at the bottom of the opening in contact with the top surface of the source/drain region 105b, portions extending along sidewalls of the opening 211, and portions extending over the gate stacks 110a/110b. In some embodiments, the metal layer 215 can also extend over the dielectric 131. In some embodiments, the metal layer 215 is formed by PVD, CLD, ALD, sputter deposition, the like, or a combination thereof to a thickness from about 30 Å to about 200 Å. In some embodiments, deposition by PVD, CLD, ALD, or sputter can be performed while applying a bias by an RF generator. The metal layer 32 may be conformally deposited to have a substantially uniform thickness along the bottom and sidewalls of the opening 211 and over the gate stacks 110a/110b.

Figure 6:
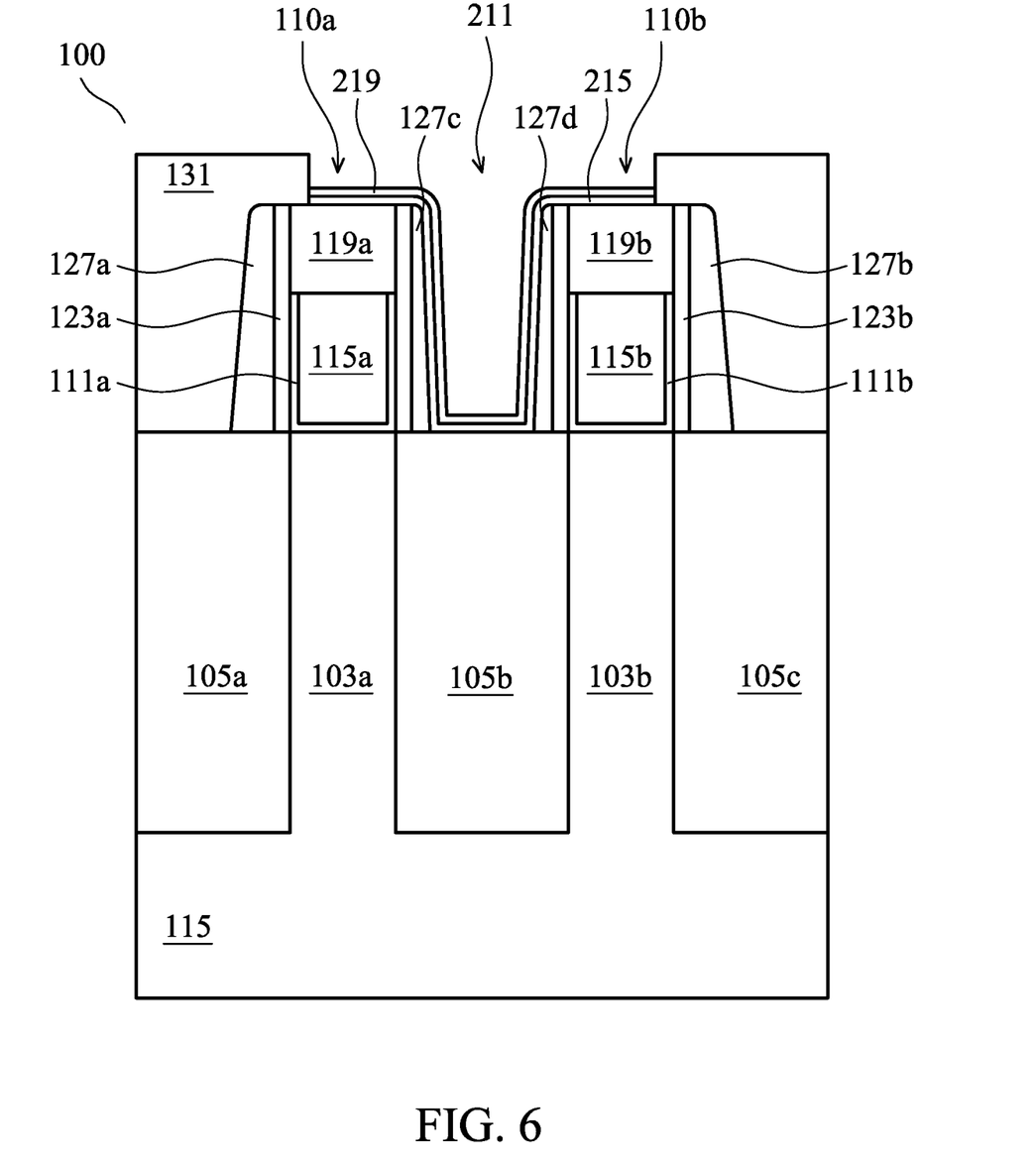

Referring to FIG. 6, a cap layer 219 is formed over the metal layer 215 and in the opening 211. The cap layer 219 improves the adhesion between the subsequently formed conductive plug 229 of FIG. 7 and also prevents oxidation of the metal layer 215. The cap layer 219 also acts as a barrier layer to aid the silicide formation. The cap layer 219 helps stabilize the metal layer 215 and prevents penetration of the metal layer 215 to conductive plug 229. The cap layer 219 can be formed of multiple layers. The cap layer 219 may be formed of titanium nitride, tantalum nitride, the like, or a combination thereof. As illustrated in FIG. 6, the cap layer 219 includes a portion at the bottom of the opening 211, portions extending along sidewalls of the opening 211, and portions extending over the gate stacks 110a/110b. In some embodiments, portions of the cap layer 219 can extend over the dielectric 131. In some embodiments, the cap layer 219 is formed by a single or multi cycle of CVD, PVD, ALD, the like, or a combination thereof to a thickness from about 5 Å to about 50 Å. The cap layer 219 may be conformally deposited to have a substantially uniform thickness along the bottom and sidewalls of the opening 211 and over the gate stacks 110a/110b.

Figure 7:
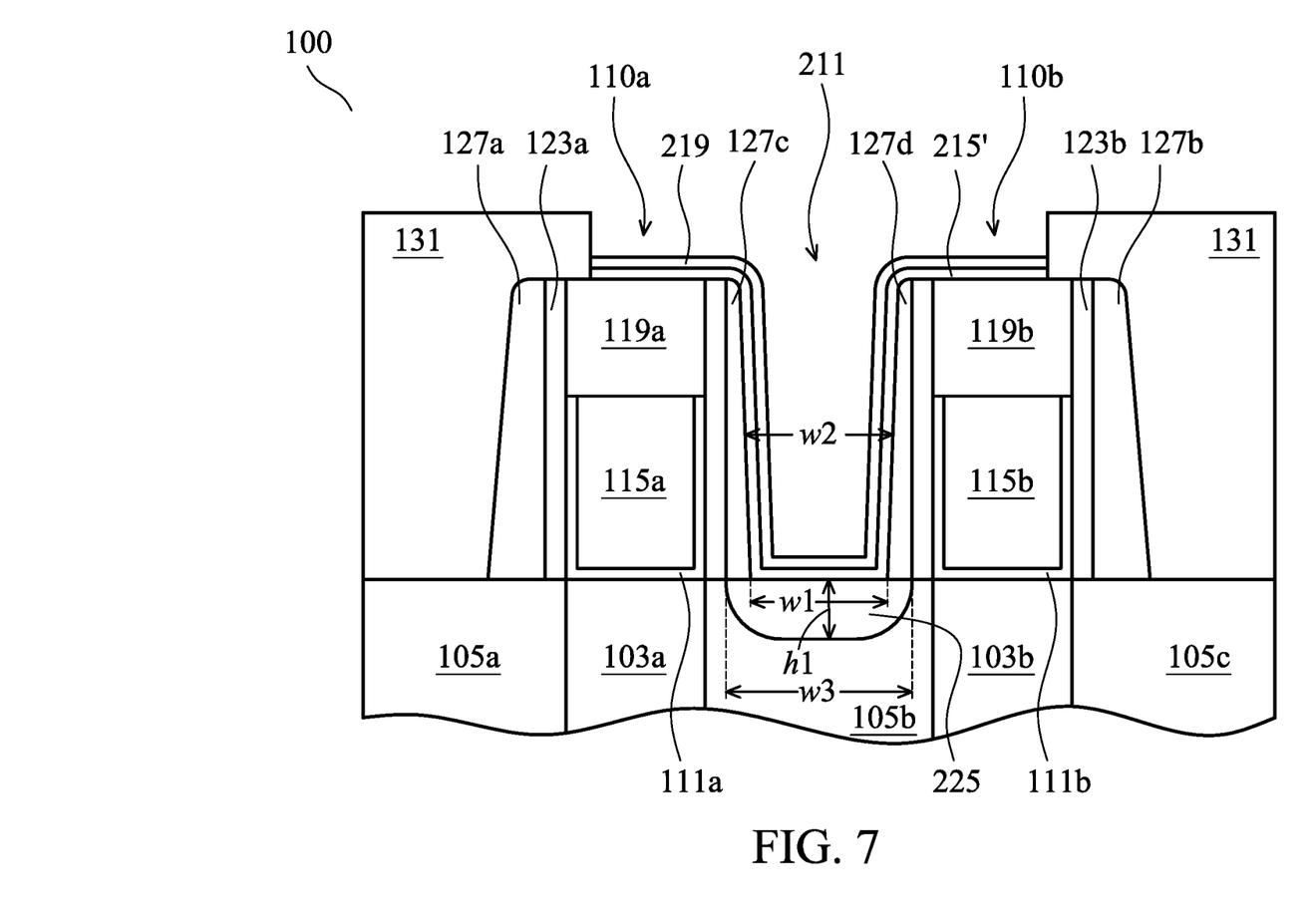

Referring to FIG. 7, a silicidation process forms the metal-silicide layer 225 from the metal layer 215. The formation of the metal-silicide layer 225 includes performing an annealing process on the semiconductor device 100. The annealing process causes the bombard material and bombarded source/drain region 105b to react with the metal layer 215 to form the metal-silicide layer 225. In some embodiments, the annealing process is performed using a rapid thermal anneal, thermal soaking, spike annealing, flash annealing, laser annealing, microwave annealing, the like, or a combination thereof. In some embodiments, the annealing process is performed at a temperature from about 100° C. to about 900° C., in an atmosphere including process gases such as $N_2$, $NH_3$, $H_2$, a mixing gas, the like, or a combination thereof, and at a pressure from 1 Torr to about 760 Torr.

In some embodiments, the anneal chamber can include a heater stage (not pictured) to hold the wafer that can be heated to a temperature from about 30° C. to about 120° C. The anneal chamber can be a plasma etching chamber having a shower head style chamber lid (not pictured) for delivering process gasses to a plasma etching chamber, where the lid also has an anneal function, such as an anneal function described above.

After the metal-silicide layer 225 is formed, in some embodiments, portions of the metal layer 215' can remain that were not converted into the metal-silicide layer 225.

As illustrated in FIG. 7, the metal-silicide layer 225 includes a depth h1 and width w3. The chemical reaction of the bombard material with the top of fin 105b helps the metal-silicide layer 225 form at a greater width and depth than it would be able to form without the chemical reaction. In some embodiments, the width w1 can be in a range of about 10 nm to about 20 nm. The width w2 can be in a range of about 15 nm to about 25 nm. The width w3 can be in a range of about 15 nm to about 30 nm. In some embodiments, the ratio of w3 to w1 increases by about 6% or more. In some embodiments, the silicide depth h1 is greater than about 6 or 7 nm. The bombardment of the bombard material with the bottom of the opening 211 can increase the pitch of the sidewalls of the contact opening 211 such that they are more vertical than before the bombardment. Where the sidewalls are gate spacers of the adjacent gate structures, the gate spacers of the opening 211 sidewall, such as gate spacers 127c and 127d, can be more vertical and thinner than the corresponding gate spacers 127a and 127b of the gate stacks. In some embodiments, the dimension ratio of the width w1 of the bottom of the opening 211 to the width w2 of the opening 211 is greater than about 90%.

Figure 11:
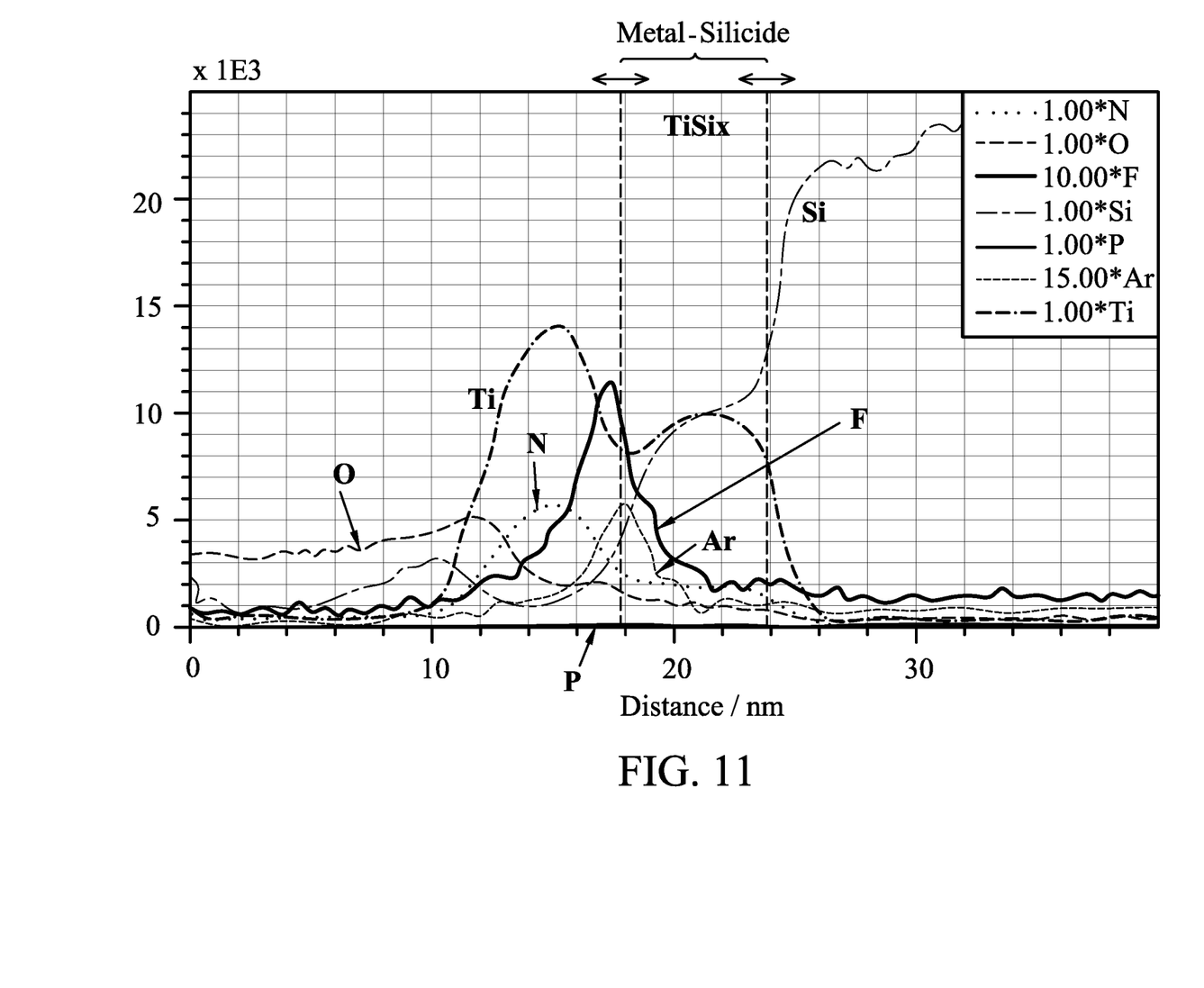
FIG. 11 illustrates a chemical index chart of a metal-silicide area of a source/drain contact in accordance with some embodiments

After the metal-silicide layer 225 is formed, the element concentrations of the bombard material (e.g., fluorine or chlorine) can be found in a chemical index at the interface of metal layer 215' and the metal-silicide layer 225. FIG. 11, discussed below, shows the relationship between these elements, using fluorine as being representative. A first concentration of the bombard material can be found at the interface of metal layer 215' and the metal-silicide layer 225, near the top of metal-silicide layer 225. The first concentration of can be a peak concentration of the bombard material in the metal-silicide layer 225. The silicidation process forming metal-silicide layer 225 can also cause the bombard material to leech back into the metal layer 215'. Thus, in some embodiments, the bombard material can be found in a chemical index at the metal layer 215'. Moving further into the metal-silicide layer 225, the chemical index for the bombard material will decrease until it becomes a trace amount. In some embodiments, at a depth of about half the silicide depth, the bombard material will exist in trace amounts. A second concentration of the bombard material can begin at a depth of about half the silicide depth and continue throughout the remaining metal-silicide layer 225 at about the same concentration.

Figure 8:
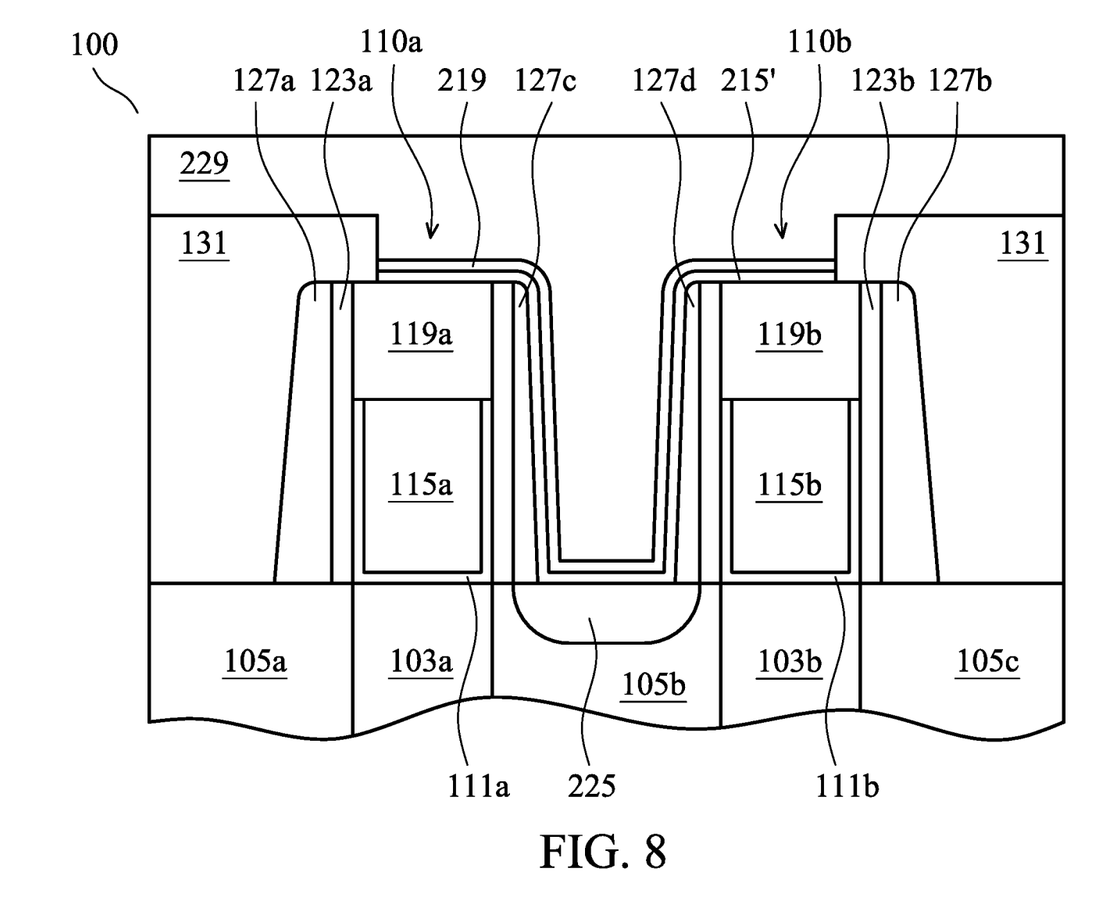

Referring to FIG. 8, the opening 211 of FIG. 7 can be filled with a conductive material 229. In some embodiments, the conductive material 229 fills the opening 211 and also extends over the dielectric layer 131. In some embodiments, the conductive material 229 can fill the opening 211 and not extend over the dielectric layer 131. The conductive material 229 will form the subsequently formed conductive plug 229' of FIG. 9. The conductive material 229 includes any appropriate metal or metal alloys such as tungsten, aluminum, copper, titanium nitride, tantalum nitride, the like, or a combination thereof. The formation of the conductive material may be performed using CVD, ALD, PVD, sputtering, the like, or a combination thereof. The conductive material 229 can be formed in multiple steps through the deposition of multiple layers.

Figure 9:
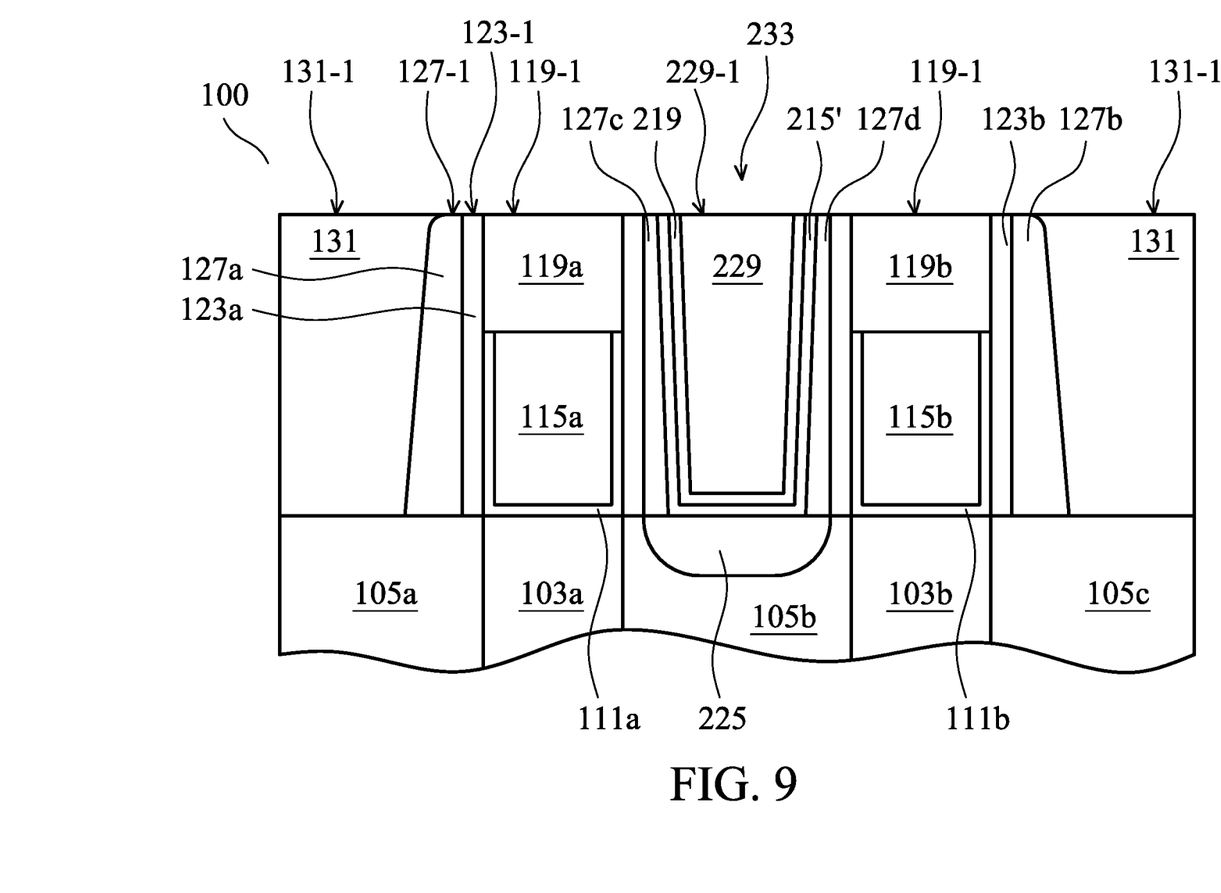

Referring to FIG. 9, a planarization process may be performed on the conductive material 229 to form the conductive plug 229'. In some embodiments, the planarization process is a chemical mechanical polishing (CMP) process, an etching process, the like, or a combination thereof. After the planarization process, the top surface 229-1 of the conductive plug 229' is substantially coplanar with the top surface 131-1 of the dielectric layer 131, the top surface 119a-1/119b-1 of the gate hardmask 119a/119b, the top surface 123-1/127-1 of the gate spacers 123/127, the uppermost surface of metal layer 215', and the uppermost surface of the cap layer 219. The metal-silicide layer 225, the unreacted metal layer 215' (if present), the cap layer 219, and the conductive plug 229' form the contact structure 233.

In some embodiments source/drain regions 105a/105c can be silicided subsequently or at the same time as the source/drain region 105b and a corresponding contact structure formed therein. Source/drain regions 105a/105c can be silicided using the same process as described above with respect to source/drain region 105b. The details are not repeated here.

In some embodiments, a gate contact can be formed over the gate stacks 110a/110b. In some embodiments, the silicidation process described above can be used to form a gate silicide for a gate contact. In some embodiments, the silicidation process described above can be used to form contacts for other types of semiconductor devices, such as other types of transistors, nano-wire transistors, and interposers.

Figure 10:
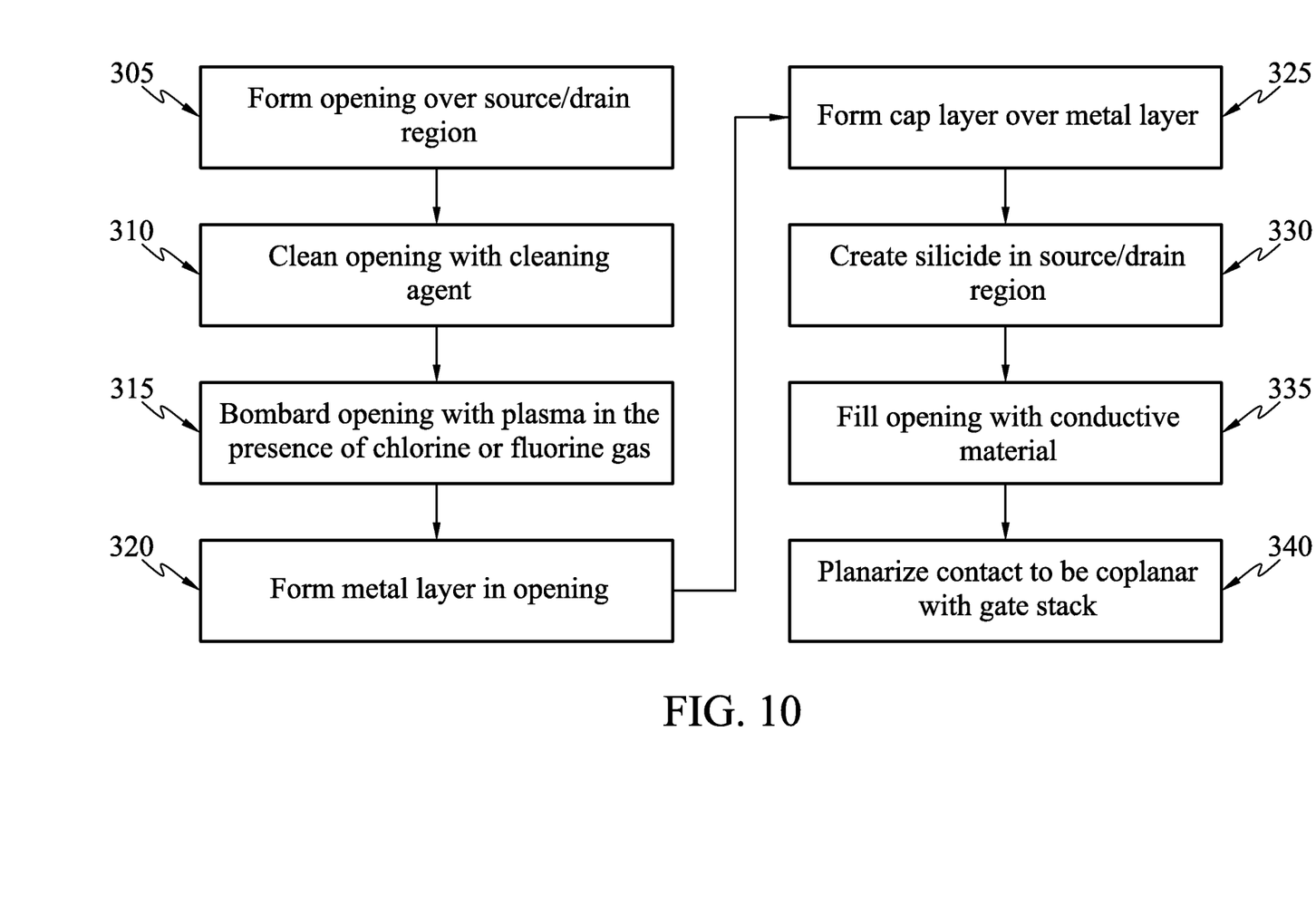
FIG. 10 is a flow diagram, in accordance with some embodiments.

FIG. 10 illustrates a flow diagram in accordance with some embodiments. After source/drain regions have been formed, such as source/drain regions 105a/105b/105c of FIG. 2, and after gate stacks have been formed, such as gate stacks 110a/110b, at 305 an opening is formed over the source/drain region(s).

At 310, the opening or openings are cleaned using a cleaning agent. In some embodiments the cleaning agent can be argon gas and plasma for etching the opening to remove any residual oxides or dielectric materials, such as residuals from dielectric material 131 of FIG. 3.

At 315, the opening or openings are bombarded with a bombard material. The bombard material can be chlorine, fluorine, or a combination thereof. Plasma can be generated by an RF generator as discussed above. In some embodiments, steps 310 and 315 can be done simultaneously. In some embodiments, steps 310 and 315 can be alternatively repeated. In some embodiments, the cleaning and physical bombard can be repeated around 1 to 5 times. In some embodiments, the cleaning and physical bombard can be repeated more times, such as 10 or 20 times. By way of the cleaning and physical bombard, gate spacers forming sidewalls of the opening can be thinned.

At 320, a metal layer is formed in the opening. The forming of the metal layer is discussed in detail above in connection with FIG. 5 and is not repeated here.

At 325, a cap layer is formed over the metal layer. The forming of the metal layer is discussed in detail above in connection with FIG. 6 and is not repeated here.

At 330, a silicide is formed in the source/drain region. Because of the reaction of the bombard material at the surface of the source/drain region, the silicide formation can be wider and deeper than it would have been otherwise. For example, the silicide can include an area under the gate spacers. The forming of the silicide is discussed in detail above in connection with FIG. 7 and is not repeated here.

At 335, the opening is filled with a conductive material. At 340, the conductive material is planarized to be substantially coplanar with the gate stacks.

FIG. 11 illustrates a chemical index chart of the metal-silicide area 225 in accordance with some embodiments. Vertical dashed lines are located in on the chart in the approximate area defined as the metal-silicide region. Each of the dashed lines is approximate and can be understood to be in a range as indicated by the arrows above each dashed line. The chemical index shows titanium and silicon forming a metal-silicide region. Also present in the metal-silicide region is fluorine, which was used in this example as the bombard material. The anneal process for forming the silicide can cause bombard material to leech or diffuse back into the metal layer 215' and capping layer 219. Thus, a concentration of bombard material can also be found in the metal layer 215' and capping layer 219. The bombard material has its peak concentration in the metal-silicide layer at the uppermost portion or surface of the metal-silicide layer. The concentration of bombard material falls significantly to a second concentration about halfway through the depth of the metal-silicide layer. The concentration of bombard material remains about the same at the second concentration for the remaining depth of the metal-silicide layer.

The contact structures 233 electrically couple the source/drain regions 105a/105b/105c to overlying structures (not shown) such as conductive lines/vias and/or other active and passive devices. For example, an interconnect structure include alternating layers of dielectric material and conductive material may be formed over the contact structures 233 and the dielectric layer 131. The contact structures 233 can electrically couple the source/drain regions 105b to this interconnect structure.

Embodiments of the present disclosure can provide the ability to lower resistance of a contact formed over the source/drain regions of a FinFET. By pre-treating a contact opening with a pre-clean process and physical bombard of a material such as chlorine or fluorine, a subsequent silicide can be formed with a lower resistivity than formation of the silicide without the pre-clean and physical bombard. The silicide can be wider and deeper into the source/drain regions. The contact hole itself can also be wider at the bottom than previously available.

In some embodiments, a device includes a metal-silicide region formed in a semiconductor material. The metal-silicide region comprises a first material and a second material. The first material comprises a metal and the second material includes chlorine, fluorine, or a combination thereof. A first concentration of the second material is in the metal-silicide region near an uppermost portion of the metal-silicide region. A capping layer is over the metal-silicide region and over sidewalls of a contact plug opening. A contact plug is formed over the capping layer, filling the contact plug opening.

In some embodiments, a semiconductor device, includes a FinFET having a first gate structure and a second gate structure disposed thereon. Each of the first and second gate structures has a first gate spacer and a second gate spacer. Each of the first gate spacers are separated from each of the second gate spacers, for example, by a gate electrode. A source/drain region is located between the first and second gate structures. The semiconductor device includes a contact. The contact includes sidewalls comprising a first metal material which coincide with the first gate spacer of the first gate structure and the second gate spacer of the second gate structure and has a bottom that includes a metal silicide on an upper surface of the source/drain region. The contact includes a conductive material plug between the contact sidewalls and over the contact bottom. A cap layer lies between the plug and the silicide. One characteristic of the semiconductor device is that the metal silicide extends under the first gate spacer of the first gate structure and the second gate spacer of the second gate structure.

Some embodiments include a method. The method includes forming an opening between a first gate and a second gate and cleaning the opening. The bottom of the opening is bombarded with a first material, thereby causing a chemical reaction between the first material and a top surface of a contact area. A metal layer is deposited in the opening. A capping layer is deposited over the metal layer. A silicide is created at the top surface of the contact area, a metal plug is deposited in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an opening in an insulating layer between a first gate and a second gate, the opening exposing a contact area of a source/drain region;
   cleaning the opening;
   bombarding a bottom of the opening with a first material, thereby causing a chemical reaction between the first material and a top surface of the contact area;
   depositing a metal layer in the opening;
   depositing a capping layer over the metal layer;
   creating a silicide at the top surface of the contact area, the silicide having a first depth, wherein an upper surface of the silicide includes a first concentration of the first material, wherein the first concentration of the first material in the silicide decreases by a first gradient to a second concentration of the first material at a second depth of the silicide, wherein the silicide has the second concentration from the second depth of the silicide to the first depth of the silicide, wherein the second depth is interposed between the top surface of the silicide and the first depth of the silicide;

after creating the silicide, depositing a metal plug in the opening.

2. The method of claim 1, further comprising:
planarizing the metal plug so that an uppermost surface of the metal plug is substantially coplanar with an uppermost surface of the first gate and an uppermost surface of the second gate.

3. The method of claim 1, wherein the silicide is wider than a bottom width of the opening, the width extending under a first spacer of the first gate and under a second spacer of the second gate.

4. The method of claim 1, wherein the cleaning and the bombarding are done simultaneously.

5. The method of claim 1, wherein the first depth of the silicide is between 6 nm and a thickness of the source/drain region.

6. The method of claim 1, wherein the first material comprises ammonia.

7. The method of claim 1, wherein the insulating layer comprises a continuous layer that laterally surrounds the first and second gate and extends over a top of the first gate and over a top of the second gate, wherein a thickness of the insulating layer is greater than a height of the first gate, wherein the opening exposes a first mask layer over a first gate electrode of the first gate and a second mask layer over a second gate electrode of the second gate, and wherein the bombarding includes bombarding the first mask layer and the second mask layer.

8. The method of claim 1, wherein the bombarding causes the opening to widen at the bottom of the opening so that a ratio of a first width at the bottom of the opening to a second width of the opening at a vertical midpoint of the first gate is greater than 90%.

9. A method, comprising:
forming a first gate structure and a second gate structure over a semiconductor fin in a direction perpendicular to the semiconductor fin, the first gate structure comprising a first gate stack and a first gate spacer disposed next to the first gate stack, the second gate structure comprising a second stack and a second gate spacer next to the second gate stack, the first gate spacer and second gate spacer each having a non-vertical sidewall;
depositing a first layer between the first gate spacer and the second gate spacer, the first layer comprising a dielectric material;
etching an opening in the first layer to expose a source/drain region of a transistor, wherein the etching uses the first gate spacer of the first gate structure and the second gate spacer of the second gate structure as an etch mask;
enlarging the opening by a cleaning process;
bombarding the exposed source/drain region with a first material, the first material reacting with a material of the source/drain region, wherein the bombarding causes the non-vertical sidewall of the first gate spacer and the non-vertical sidewall of the second gate spacer to become more vertical, wherein after bombarding the exposed source/drain region a ratio of a first width at a bottom of the opening to a second width of the opening at a vertical midpoint of the first gate structure is greater than 90%;
depositing a metal film in the opening; and
siliciding the source/drain region to form a silicide region in the source/drain region, wherein a first concentration of the first material in the silicide region decreases in a gradient further from the upper surface of the silicide region until an intermediate location of the silicide region, wherein a second concentration of the first material in the silicide region is substantially uniform from the intermediate location of the silicide region to a depth of the silicide region.

10. The method of claim 9, further comprising:
prior to siliciding the source/drain region, forming a capping layer over the metal film.

11. The method of claim 10, further comprising:
forming a metal plug in the opening, wherein following the forming the metal plug, the capping layer remains interposed between the metal plug and the silicide region.

12. The method of claim 9, wherein the cleaning process and bombarding are performed in a same process step.

13. The method of claim 9, wherein the first material comprises fluorine, chlorine, or a combination thereof.

14. The method of claim 9, further comprising:
forming a third gate spacer interposed between the first gate spacer and the first gate stack; and
forming a fourth gate spacer interposed between the second gate spacer and the second gate stack, wherein the silicide region extends horizontally beyond lateral extents of the opening, wherein the silicide region extends under the first gate spacer to the third gate spacer and under the second gate spacer to the fourth gate spacer.

15. The method of claim 9, wherein the first material comprises ammonia.

16. A method, comprising:
forming a source/drain region between a first gate stack and a second gate stack;
forming an insulating layer over the source/drain region, the insulating layer extending over the first gate stack and the second gate stack;
etching an opening in the insulating layer, the opening exposing the source/drain region, an upper portion of the first gate stack, and an upper portion of the second gate stack;
bombarding the source/drain region with a first material, the first material comprising chlorine; and
forming a silicide region at an upper portion of the source/drain region, the silicide region extending laterally further than the opening, an upper surface of the silicide region including a first concentration of the first material, wherein the first concentration of the first material in the silicide region decreases in a gradient further from the upper surface of the silicide region until an intermediate location of the silicide region, wherein a second concentration of the first material in the silicide region is substantially uniform from the intermediate location of the silicide region to a depth of the silicide region.

17. The method of claim 16, wherein forming the silicide region comprises:
depositing a first metal film in the opening, the first metal film contacting the source/drain region;
depositing a capping layer in the opening over the first metal film; and
annealing the source/drain region.

18. The method of claim 16, further comprising:
depositing a metal plug in the opening, wherein a third concentration of the first material is disposed in the metal plug; and
planarizing the metal plug and insulating layer to level an uppermost surface of the metal plug with an uppermost surface of the first gate stack.

19. The method of claim 16, further comprising:
in conjunction with the bombarding the source/drain region, enlarging the opening through a cleaning etch process.

20. The method of claim 16, wherein, the bombarding causes a first non-vertical sidewall of the opening to become more vertical, the first non-vertical sidewall of the opening including a spacer of the first gate stack.

* * * * *

UNITED STATES PATENT AND TRADEMARK OFFICE
CERTIFICATE OF CORRECTION

PATENT NO.         : 10,510,851 B2                                Page 1 of 1
APPLICATION NO.    : 15/583570
DATED              : December 17, 2019
INVENTOR(S)        : Yu-Sheng Wang et al.

It is certified that error appears in the above-identified patent and that said Letters Patent is hereby corrected as shown below:

On the Title Page

Item (54), and in the Specification Column 1, Line 1, delete "RESISTANCE" and insert --RESISTANT--.

In the Claims

In Column 11, Line 5, Claim 1, delete "silicide;" and insert --silicide; and--.

Signed and Sealed this
Sixth Day of October, 2020

Andrei Iancu
*Director of the United States Patent and Trademark Office*